(12) United States Patent
Heikkinen et al.

(10) Patent No.: US 10,383,232 B2
(45) Date of Patent: *Aug. 13, 2019

(54) THERMOFORMED PLASTIC COVER FOR ELECTRONICS AND RELATED METHOD OF MANUFACTURE

(71) Applicant: TactoTek Oy, Oulunsalo (FI)

(72) Inventors: Mikko Heikkinen, Oulu (FI); Jarmo Sääski, Kempele (FI); Jarkko Torvinen, Kempele (FI)

(73) Assignee: TACTOTEK OY, Oulunsalo (FI)

( * ) Notice: Subject to any disclaimer, the term of this patent is extended or adjusted under 35 U.S.C. 154(b) by 0 days.

This patent is subject to a terminal disclaimer.

(21) Appl. No.: 15/937,172

(22) Filed: Mar. 27, 2018

(65) Prior Publication Data

US 2018/0220534 A1    Aug. 2, 2018

Related U.S. Application Data

(63) Continuation of application No. 15/158,645, filed on May 19, 2016, now Pat. No. 10,064,282.
(Continued)

(51) Int. Cl.
*H05K 1/02* (2006.01)
*H05K 1/18* (2006.01)
(Continued)

(52) U.S. Cl.
CPC ......... *H05K 1/186* (2013.01); *H01L 23/4985* (2013.01); *H01L 23/5387* (2013.01);
(Continued)

(58) Field of Classification Search
CPC ......... H01L 2224/1319; H01L 23/5387; H01L 23/4985; H01L 51/0097
See application file for complete search history.

(56) References Cited

U.S. PATENT DOCUMENTS 5,951,349 A    9/1999 Larose et al.
6,049,463 A    4/2000 O'Malley et al.
(Continued)

FOREIGN PATENT DOCUMENTS

CN    204036746 U    12/2014
DE    102012204630 A1    9/2013
(Continued)

OTHER PUBLICATIONS

Written Opinion of the International Preliminary Examining Authority issued by the Finnish Patent and Registration Office acting as the International Preliminary Examining Authority in relation to PCT/FI2016/050337 dated Aug. 29, 2016 (8pages).
(Continued)

*Primary Examiner* — Ngan V Ngo
(74) *Attorney, Agent, or Firm* — Robert P. Michal, Esq.; Carter, DeLuca & Farrell LLP

(57) ABSTRACT

A multilayer structure for an electronic device including a flexible substrate film for accommodating electronics; at least one electronic component provided on the substrate film; and a number of conductive traces provided on the substrate film for electrically powering and/or connecting electronics including the at least one electronic component, wherein at least one preferably thermoformed cover is attached to the substrate film on top of the at least one electronic component, the at least one thermoformed cover and the substrate film accommodating the electronics being overmolded with thermoplastic material. The invention also relates to a method for manufacturing a multilayer structure for an electronic device.

11 Claims, 3 Drawing Sheets

Related U.S. Application Data

(60) Provisional application No. 62/163,410, filed on May 19, 2015.

(51) Int. Cl.
    *H05K 3/28*       (2006.01)
    *H01L 33/52*     (2010.01)
    *H01L 51/00*     (2006.01)
    *H01L 23/498*    (2006.01)
    *H01L 23/538*    (2006.01)

(52) U.S. Cl.
CPC .......... *H01L 33/52* (2013.01); *H01L 51/0097* (2013.01); *H05K 1/0274* (2013.01); *H05K 1/0298* (2013.01); *H05K 3/284* (2013.01); *H01L 2224/1319* (2013.01); *H01L 2933/005* (2013.01); *H05K 1/189* (2013.01); *H05K 2201/0129* (2013.01); *H05K 2201/05* (2013.01); *H05K 2201/09872* (2013.01); *H05K 2201/10106* (2013.01); *H05K 2201/10151* (2013.01); *H05K 2203/1316* (2013.01); *H05K 2203/1322* (2013.01)

(56) References Cited

U.S. PATENT DOCUMENTS

| | | |
|---|---|---|
| 6,682,331 B1 | 1/2004 | Peh et al. |
| 7,083,311 B2 | 8/2006 | Schreck et al. |
| 7,301,176 B2 | 11/2007 | Abe et al. |
| 10,064,282 B2 * | 8/2018 | Heikkinen ............. H05K 1/186 |
| 2003/0134450 A1 | 7/2003 | Lee |
| 2003/0160256 A1 | 8/2003 | Durocher et al. |
| 2004/0152234 A1 | 8/2004 | Usui et al. |
| 2004/0223328 A1 | 11/2004 | Lee et al. |
| 2006/0104037 A1 | 5/2006 | Smith et al. |
| 2006/0158804 A1 | 7/2006 | Usui et al. |
| 2006/0198569 A1 | 9/2006 | Ohtsu et al. |
| 2007/0029569 A1 | 2/2007 | Andrews |
| 2007/0121326 A1 | 5/2007 | Nall et al. |
| 2007/0205425 A1 | 9/2007 | Harada |
| 2008/0062711 A1 | 3/2008 | Veenstra et al. |
| 2008/0102726 A2 | 5/2008 | Jeganathan et al. |
| 2008/0206549 A1 * | 8/2008 | Dodo ....................... A61F 7/03 428/320.2 |
| 2008/0285910 A1 | 11/2008 | Yamada et al. |
| 2009/0154182 A1 | 6/2009 | Veenstra et al. |
| 2009/0186454 A1 | 7/2009 | Miyawaki et al. |
| 2009/0295494 A1 * | 12/2009 | Carter .................... H01P 5/103 333/26 |
| 2009/0303411 A1 | 12/2009 | Kawato et al. |
| 2010/0200327 A1 * | 8/2010 | Marcel ............... B29C 44/0461 181/290 |
| 2011/0176280 A1 * | 7/2011 | Lee .......................... H01L 25/16 361/721 |
| 2011/0199340 A1 | 8/2011 | Aikio et al. |
| 2012/0201024 A1 | 8/2012 | van de Ven |
| 2013/0062652 A1 | 3/2013 | Thompson et al. |
| 2013/0176689 A1 | 7/2013 | Nishimura et al. |
| 2013/0294107 A1 | 11/2013 | Ohkawa et al. |
| 2013/0299789 A1 | 11/2013 | Yamazaki et al. |
| 2014/0200581 A1 * | 7/2014 | Aluru .................... A61B 18/14 606/48 |
| 2015/0041616 A1 | 2/2015 | Gentile et al. |
| 2015/0054003 A1 | 2/2015 | Oraw |
| 2015/0098248 A1 | 4/2015 | Wakaki |
| 2016/0004947 A1 | 1/2016 | Pueschner et al. |
| 2016/0009216 A1 | 1/2016 | Song et al. |
| 2016/0031151 A1 | 2/2016 | Tan et al. |
| 2016/0037623 A1 | 2/2016 | Fjelstad |
| 2016/0066859 A1 | 3/2016 | Crawford et al. |
| 2016/0070339 A1 | 3/2016 | Crawford et al. |
| 2016/0072177 A1 | 3/2016 | Sharma et al. |
| 2016/0072554 A1 | 3/2016 | Sharma et al. |
| 2016/0181677 A1 * | 6/2016 | Christopher ......... H05K 9/0032 333/202 |
| 2016/0295702 A1 | 10/2016 | Heikkinen et al. |
| 2016/0328043 A1 | 11/2016 | Moller et al. |
| 2017/0043580 A1 | 2/2017 | Takagi et al. |
| 2017/0072620 A1 | 3/2017 | Kawaguchi et al. |
| 2017/0294387 A1 | 10/2017 | Kawabata et al. |
| 2017/0296808 A1 | 10/2017 | Greenberg et al. |

FOREIGN PATENT DOCUMENTS

| | | |
|---|---|---|
| WO | 2012170107 A1 | 12/2012 |
| WO | 2014097835 A1 | 6/2014 |

OTHER PUBLICATIONS

International Search Report issued by the Finnish Patent and Registration Office acting as the International Searching Authority in relation to PCT/FI2016/050337 dated Aug. 30, 2016 (5 pages).

Alajoki, T. et al., Hybrid In-Mould Integration for Novel Electrical and Optical Features in 3D Plastic Products, 4th Electronic System-Integration Technology Conference, ESTC 2012 (published Sep. 17, 2012).

International Preliminary Report on Patentability issued by the Finnish Patent and Registration Office acting as the International Preliminary Examining Authority in relation to PCT/FI2016/050337 dated Aug. 30, 2017 (7 pages).

Extended European Search Report issued by the European Patent Office in relation to European Application 16795951.9 dated Dec. 12, 2018 (5 pages).

Office Action issued by The State Intellectual Property Office in P.R. China in relation to Chinese Application No. 201680037545.7 dated Mar. 21, 2019 (8 pages) along with English language translation (3 pages).

\* cited by examiner

THERMOFORMED PLASTIC COVER FOR ELECTRONICS AND RELATED METHOD OF MANUFACTURE

This is a Continuation of U.S. patent application Ser. No. 15/158,645 filed May 19, 2016, which claims the benefit of Provisional Application 62/163,410 filed May 19, 2015, the entire disclosure of each of which is incorporated herein by reference.

TECHNICAL FIELD

The present invention concerns in general the technical field of electronics, related devices, structures, and methods of manufacture. In particular, however not exclusively, the present invention concerns manufacturing a multilayer structure for integrated and embedded electronics.

BACKGROUND

Generally there exists a variety of different stacked assemblies and structures in the context of electronics and electronic products.

The motivation behind the integration of electronics and related products may be as diverse as the related use contexts. Relatively often size savings, weight savings, cost savings, or just efficient integration of components is sought for when the resulting solution ultimately exhibits a multi-layer nature. In turn, the associated use scenarios may relate to product packages or food casings, visual design of device housings, wearable electronics, personal electronic devices, displays, detectors or sensors, vehicle interiors, antennae, labels, vehicle electronics, etc.

Electronics such as electronic components, ICs (integrated circuit), and conductors, may be generally provided onto a substrate element by a plurality of different techniques. For example, ready-made electronics such as various surface mount devices (SMD) may be mounted on a substrate surface that ultimately forms an inner or outer interface layer of a multilayer structure. Additionally, technologies falling under the term "printed electronics" may be applied to actually produce electronics directly to the associated substrate. The term "printed" refers in this context to various printing techniques capable of producing electronics/electrical elements, including but not limited to screen printing, flexography, and inkjet printing, through substantially additive printing process. The used substrates may be flexible and printed materials organic, which is however, not necessarily always the case.

For example, the aforementioned wearable electronics and generally wearable technology such as smart clothing fuses textiles, other wearable materials and electronic devices to make a wearer's life easier by implementing different aspects of ubiquitous computing for both private and business purposes in wearable items such as garments. Recent advancements in material technology and miniaturization have brought forward solutions that the users have only dreamed about a decade or two ago. Hard shell wearable technology such as various smart watches or generally wristop devices has been limitedly available for some time now starting from the 80's wristop calculator watches evolving into sports/fitness computers, activity monitors and most recently, various communications-enabled apparatuses approaching e.g. cell phones and tablets in terms of embedded features. Yet, few wearable smart glasses and e.g. personal security-related products have hit the markets since. Actual e-textiles or 'smart textiles' have also been introduced during the last few years with reference to fabrics that provided for integration with electronics such as sensory integration. The e-textiles may incorporate both electrically conductive materials, such as conductive yarn, and insulating materials for providing the desired electrical properties to the components embedded therewithin.

FIG. 1 illustrates one example of a multilayer structure 100 of integrated and embedded electronics. A substrate 102 is provided to accommodate a number of electronic components 104 and a number of conductor traces 106 for connecting the electronic components 104. Additionally, a top layer 108 is provided on top of the electronic components 104 and substrate layer 102 as a support structure using a suitable lamination method involving the use of e.g. adhesives, elevated temperatures and/or pressure.

However, one drawback of the prior art solution is that the electronic components 104 may easily crack or break when the top layer 108 is provided on top of the electronic components 104. In FIG. 1 a prospective crack in the component is illustrated with a dashed line 110. For example the regulation of the pressure/temperature to maintain it at a decent level during the lamination is challenging. If the pressure/temperature is too high the components 104 may crack or break, and on the other hand if the pressure/temperature is too low the composition of the top layer 108 turns out incorrect and/or the top layer is not attached properly, for instance. The cracking or breaking of the electronic components 104 during the manufacturing process cause increase in manufacturing costs for multilayer structural electronic devices. Therefore there exists a need for improving the manufacturing procedure of the multilayer structures for the electronic devices.

SUMMARY

An objective of the invention is to present a multilayer structure and method for an electronic device at least alleviating one or more of the defects of the prior art described above.

The objectives of the invention are reached by a multilayer structure and a method as defined by the respective independent claims. Various embodiments of the multilayer structure and the method for an electronic device provide a solution to protect and optionally secure the electronics when a further top layer is provided on top of the electronics or from environmental conditions such as moisture, heat, cold, dirt, shocks, etc.

According to a first aspect a multilayer structure for an electronic device comprises a flexible substrate film for accommodating electronics; at least one electronic component provided on said substrate film; and a number of conductive traces provided on said substrate film for electrically powering and/or connecting electronics including said at least one electronic component, wherein at least one cover is attached to said substrate film on top of said at least one electronic component, being overmolded with thermoplastic material.

Preferably said cover is or comprises plastic, most preferably plastic thermoformed so as to substantially define a dome or other applicable cap shape for accommodating underlying electronics.

The at least one cover may comprise a single cover placed on top of a plurality of electronic components. Alternatively or in addition, the multilayer structure may comprise at least two covers placed at least partially on top of at least two electronic components, respectively. A plurality of at least functionally separate covers may be physically provided as a one continuous, optionally monolithic, object or as a plurality of discrete physical objects.

The substrate film (surface) may be encompassed partially or completely by at least one, preferably plastic, cover. The at least one cover may define a number of optionally rounded, preferably dome-shaped, protective caps for electronics. Additionally, the at least one cover may comprise optically transparent or translucent material having regard to predefined electromagnetic wavelengths including wavelengths of e.g. visible spectrum. The at least one cover may further comprise or define a number of through-holes configured, for instance, to enable the light emitted and/or captured by the at least one electronic component to propagate therewithin and outcouple therefrom.

The substrate film may comprise optically transparent or translucent material as to predefined electromagnetic wavelengths including wavelengths of e.g. visible spectrum.

Also the thermoplastic material may comprise optically transparent or translucent material having regard to predefined wavelengths including e.g. wavelengths of visible spectrum. The thermoplastic material may optionally comprise a plurality of layers, wherein different layers may exhibit different properties such as elasticity, optical transparency/transmittance, glass transition temperature, and/or melting point.

The at least one electronic component may include at least one optoelectronic, light-emitting, light-detecting, and/or light-sensing component, preferably a LED (light-emitting diode) or photodiode. Alternatively or additionally it may include e.g. a communications, memory and/or processing element, optionally in a form of an integrated circuit. For example, a microcontroller or a communication chip may be included.

According to a second aspect, an electronic device is provided. The electronic device is optionally a light-emitting device, light-detecting device, light-sensing device, smart garment or other wearable electronics, smart compression garment, wristop device, armband device, cellular device, tablet, phablet, controller device, computer mouse, joystick, other computer accessory, a display device, vehicle or in-vehicle (e.g. dashboard) electronics, or e.g. a laptop computer, comprising an embodiment of the multilayer structure as described above.

According to a third aspect, a method for manufacturing a multilayer structure for an electronic device is provided. The method comprises steps of obtaining a flexible substrate film for accommodating electronics; providing, preferably printing, a number of conductor traces on said substrate film for electrically powering and/or connecting electronic components and/or a number of predefined areas on the substrate; providing at least one electronic component on said substrate film, preferably by means of printed electronics and/or surface mounting; placing at least one cover at least partially on top of said at least one electronic component; attaching said at least one cover to said substrate film; and molding thermoplastic material on said at least one cover and substrate film accommodating the electronic components.

The method may further comprise initially thermoforming the cover.

The selected printing method may be one of so-called printed electronics printing methods including e.g. screen printing and ink jetting. Preferably, additive manufacturing such as additive printing technology is thus applied in connection with embodiments of the present invention.

The attaching may comprise securing the at least one cover with adhesive, soldering, and/or mechanical fixing such as hook and loop fasteners. The molding may comprise injection molding. The method may further comprise providing a number of through-holes to the cover to enable the light emitted, detected and/or sensed by the at least one component to propagate therewithin and outcouple therefrom.

The expression "a number of" may herein refer to any positive integer starting from one (1).

The expression "a plurality of" may refer to any positive integer starting from two (2), respectively.

The exemplary embodiments of the invention presented in this patent application are not to be interpreted to pose limitations to the applicability of the appended claims. The verb "to comprise" is used in this patent application as an open limitation that does not exclude the existence of also un-recited features. The features recited in depending claims are mutually freely combinable unless otherwise explicitly stated.

The novel features which are considered as characteristic of the invention are set forth in particular in the appended claims. The invention itself, however, both as to its construction and its method of operation, together with additional objectives and advantages thereof, will be best understood from the following description of specific embodiments when read in connection with the accompanying drawings.

BRIEF DESCRIPTION OF FIGURES

The embodiments of the invention are illustrated by way of example, and not by way of limitation, in the figures of the accompanying drawings.

DESCRIPTION OF SOME EMBODIMENTS

Figure 1:
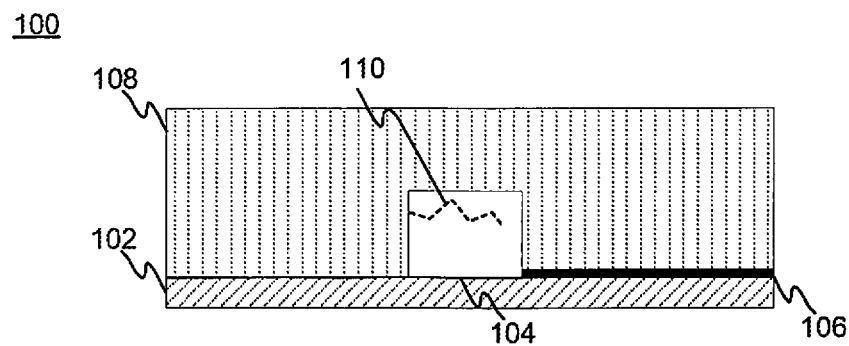
FIG. 1 illustrates one example of a prior art multilayer structure.
Figure 2:
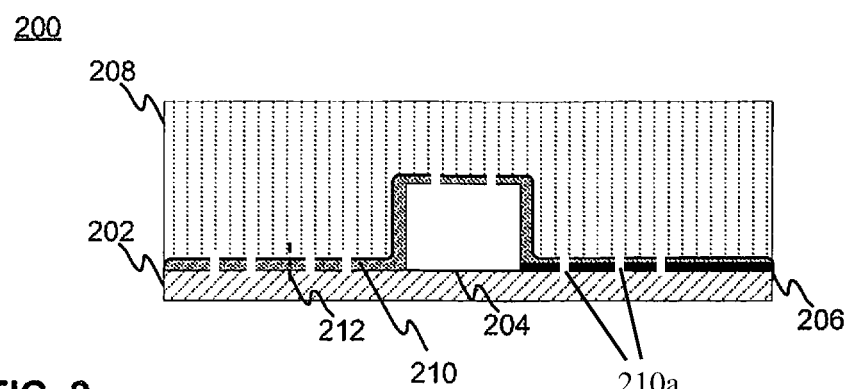
FIG. 2 illustrates a side view of an embodiment of a multilayer structure according to the present invention.

FIG. 2 illustrates a side view of an embodiment of a planar type multilayer structure 200 according to the present invention comprising a substrate film 202, at least one electronic component 204, at least one, preferably thermoformed, cover 210, and at least one thermoplastic material layer 208. The substrate 202, preferably a flexible plastic film, foil, or sheet, is shown as cut and/or otherwise configured into a substantially rectangular or other desired shape. The substrate 202 may be generally shaped according to the requirements set by each use scenario. It may also exhibit e.g. a circular or square general shape.

The substrate film 202 may substantially consist of or at least comprise one material selected from the group consisting of: polymer, thermoplastic material, PMMA (Polymethyl methacrylate), Poly Carbonate (PC), polyimide, a copolymer of Methyl Methacrylate and Styrene (MS resin), glass and Polyethylene Terephthalate (PET).

In some embodiments, the substrate film 202 may be coated or covered by further material layers e.g. on the side facing the environment (i.e. not the electronics). E.g. a textile layer or biological or bio-based materials (e.g. leather, wood, paper, cardboard) in addition to or instead of more conventional additional layers may be provided. Also e.g. rubber or generally rubberous material may be used.

Additionally, the substrate film 202 may at least partially be optically substantially opaque or at least translucent, if not transparent, having regard to predefined wavelengths e.g. in visible spectrum. The substrate film 202 may have been initially provided with visually distinguishable, decorative/aesthetic and/or informative, features such as graphical pattern thereon. The features may have been provided on the same side of the substrate film 202 with the electronics 204 so that they have been also sealed by the overmolded plastic material layer 208. Accordingly, IML (in-mold labeling) or IMD (in-mold decoration) technique may be thus applied in the manufacturing phase. Optionally, a number of optical features could be provided by surface relief forms such as grooves or protrusions of the substrate film 202. Such features could be obtained by embossing, carving, stamping, molding, etc.

The substrate film 202 may contain recesses, notches, cuts or openings for providing optical path and/or e.g. access to the elements provided on the substrate film 202, on either side thereof. For example, for enabling a battery change (of embedded battery) or generally component change, or for accessing a UI (user interface) feature (e.g. touch-sensitive area, button or switch) the substrate film 202 could be provided with a related access route.

The multilayer structure 200 presented in FIG. 2 comprises at least one electronic component 204 that is provided on the substrate film 202. The multilayer structures may comprise electronics 204 including one or more electronic components such as passive components and/or active components, which may comprise optoelectronic component(s). The optoelectronic component(s) may include a number of LEDs (light-emitting diode), or other light-emitting components, for example. Alternatively or additionally, the component(s) may include a light-receiving or light-sensitive component such as a photodiode, photoresistor, other photodetector, or e.g. a photovoltaic cell.

The electronics 204 may include at least one element selected from the group consisting of: optoelectronic component, microcontroller, microprosessor, signal processor, DSP (digital signal processor), sensor, programmable logic chip, memory, transistor, resistor, capacitor, inductor, memory array, memory chip, data interface, transceiver, wireless transceiver, transmitter, receiver, wireless transmitter, and wireless receiver. Different sensing and/or other functionalities may be implemented by the embedded ICs, dedicated components, or shared ICs/electronics (multi-purpose electronics).

The electronics 204 may include printed electronics obtained by printed electronics technology such as screen printing or ink jetting. Additionally or alternatively, the electronics 204 may include e.g. surface-mounted elements. For example, adhesive may be utilized for mechanically securing the electronics on the substrate.

Electrical connections such as a number of traces 206 between the electronic components 204 or between the electronic component(s) 204 and e.g. external electronics disposed outside the multilayer structure may be provided by conductors and contact areas, which may be printed, for instance, on the substrate 202 by means of printed electronics and e.g. conductive ink. The conductive traces 206 may be used for power supply and signalling of control and/or other data. Conductive materials such as conductive adhesive and/or solder may be applied for establishing electrical and also mechanical connections.

The cover 210 defining e.g. a protective cap may be placed at least partially on top of the electronic component 204. The cover 210 is configured to be attached to the substrate film 202 with e.g. adhesive, solder, and/or mechanical fixing such as screws, nails, bolts, or hook and loop fasteners (colloquially known as Velcro) applicable for securing the thermoformed cover 210 on the substrate film 202. The cover 210 protects and optionally secures the electronic components 204 when thermoplastic material 208 is further molded on the substrate film 202 already accommodating the electronic components 204. Additionally, the cover 210, which may indeed define a protective cap for the underlying electronics, may be configured to protect the electronics 204 from e.g. environmental conditions such as moisture, heat, cold, dirt, shocks, etc. Thermoforming from plastic sheet or film is a fast and low-cost procedure to obtain a cover with desired shapes to protect and secure the electronic components 204. Additionally, the placing and attaching of the cover 210 may be provided so that the electronic components 204 are not damaged.

The cover 210 may substantially consist of or at least comprise at least one material selected from the group consisting of: polymer, thermoplastic material, PMMA (Polymethyl methacrylate), Poly Carbonate (PC), polyimide, a copolymer of Methyl Methacrylate and Styrene (MS resin), glass and Polyethylene Terephthalate (PET). The cover 210 may also consist of or comprise rubber or rubbery material, e.g. natural rubber such as latex or synthetic rubber such as styrene butadiene (SBR), polybutadiene (BR), polyether urethane (EU), or fluoro silicone (FMQ), etc. The elasticity of the rubbery material may be preferable at some situations. Additionally, the cover 210 may also consist of or at least comprise conductive metallic material such as aluminium, copper or other similar materials to provide e.g. a Faraday cage around the electronic components 204 to protect the components 204 from electric charges.

The material of cover 210 may in some embodiments be opaque. Alternatively, it may at least partially be optically transparent or translucent so that the visible light and/or electromagnetic radiation at some other predefined wavelength(s) are enabled to pass through it with negligible loss. The transmittance may be at least about 80%, 85%, 90%, or 95% at those wavelength(s). Alternatively or in addition, the thermoformed cover 210 may comprise a number of through-holes, cuts, and/or openings 210a (see FIG. 2) configured to enable e.g. the light emitted, detected and/or sensed by at least one electronic component 204 to propagate therewithin and outcouple therefrom. Generally, the holes or cuts may enable more efficient interaction of the embedded electronics with the environment outside the cover 210.

The shape and generally dimensions of the cover 210 may be decided application-specifically. The shape may be angular, rounded e.g. dome-shaped etc. The rounded-shaped cover 210 may exhibit better pressure distribution and/or durability. The shape and/or dimensions of the cover 210 may also be defined according to the shape and/or dimensions of the relating electronic components 204. The cover 210 may coat partially or completely the surface of the substrate film 202 that accommodates the electronic components 204. In FIG. 2 the cover 210 extends at the edges of the substrate film 202 to overlay the (top surface of the) substrate film 202 completely. Alternatively, the cover 210 could overlap the substrate film 202 partially as illustrated in FIG. 2, where the cover 210 might alternatively end e.g. at the location of a dashed line 212.

Instead of or in addition to opaque material, the molded thermoplastic material 208 may comprise optically substantially transparent or translucent material so as to enable the visible light and/or electromagnetic radiation at some other predefined wavelength(s) to pass through it with negligible loss. The transmittance may be at least about 80%, 85%, 90%, or 95% at those wavelength(s). The radiation/light may be emitted, detected and/or sensed by the electronics 204 provided on the substrate film 202. The shape and generally dimensions of the molded layer 208 may be decided application-specifically. In FIG. 2, the molded layer 208 exhibits a rectangular profile but e.g. a rounded profile is possible as well.

Figure 3:
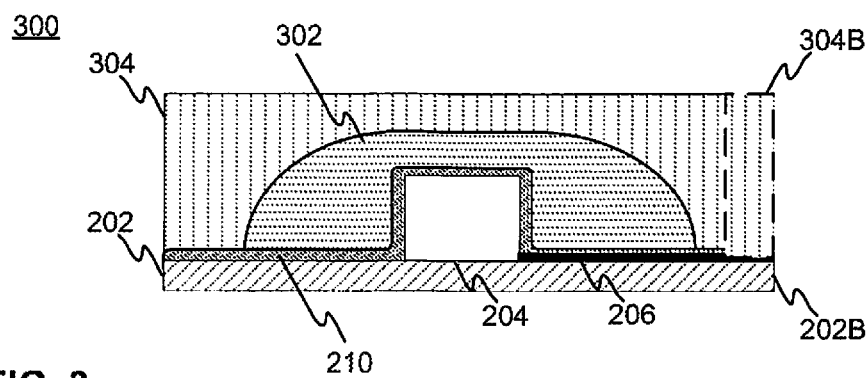
FIG. 3 illustrates a side view of a second embodiment of a multilayer structure according to the present invention.

The thermoplastic material may comprise multiple layers, which is illustrated with a side view of an embodiment in FIG. 3. The materials of thermoplastic layers 302, 304 may differ from each other in a variety of ways such as dimensions and/or thickness, elasticities, optical transparencies/transmittances, glass transition temperatures, and/or melting points. Also the functionalities of the different thermoplastic material layers 302, 304 may be different from each other.

In some optional embodiments as indicated by numeral 202B and the dashed potentially missing/removed portion 304B of molded second material 304 thereon, one or more edges or edge areas of the substrate 202 may indeed be left unmolded or the molded material may be removed therefrom afterwards so that e.g. electrical coupling to external elements and/or mounting is facilitated. Such edge portions may accommodate part of the conductors 206 for the purpose. Alternatively or additionally, the electrical coupling elements such as conductors could be funnelled from the inside of the multilayer structure 300 to the border/edge therefor in favour of external connectivity even if the substrate edge 202B was not kept free from the molded material.

Figure 4A:
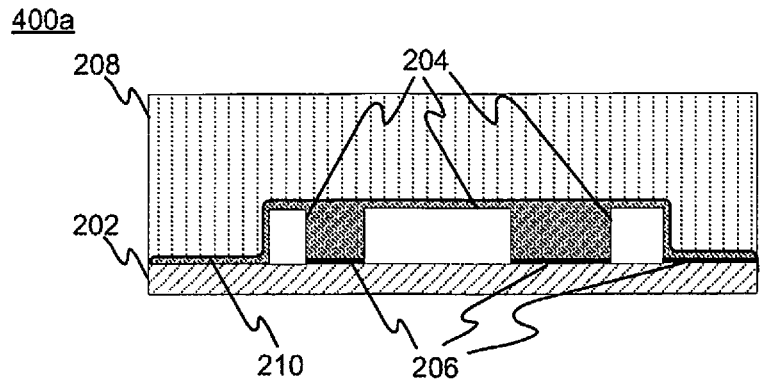
FIG. 4A illustrates a side view of a third embodiment of a multilayer structure according to the present invention.

FIG. 4A presents a side view of one embodiment of e.g. planar type multilayer structure 400a according to the present invention comprising substrate film 202, a number of electronic components 204, one preferably thermoformed cover 210, and at least one thermoplastic material layer 208 molded thereon. The considerations set forth regarding FIG. 2 or FIG. 3 generally apply also here and vice versa what comes to properties and configuration of different materials, dimensions, electronics, etc. The cover 210 may be placed at least partially on top of the multiple electronic components 204 for protecting and securing the electronic components 2104 when the thermoplastic material 208 is molded on the substrate film 202 accommodating the electronic components 204.

Figure 4B:
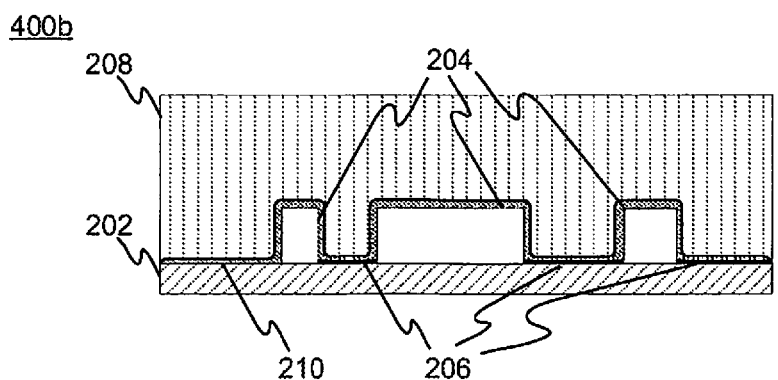
FIG. 4B illustrates a side view of a fourth embodiment of a multilayer structure according to the present invention.

Another embodiment of a planar type multilayer structure 400b according to the present invention comprising substrate film 202, a number of electronic components 204, a plurality of at least functionally separable (e.g. in the light of target electronics such as components such as passive components or chips to be protected) if not physically separate, preferably thermoformed, covers 210, and at least one thermoplastic material layer 208 is illustrated in FIG. 4b. The considerations set forth regarding FIG. 2 or 3 generally apply also here and vice versa what comes to properties and configuration of different materials, dimensions, electronics, etc. Each cover 210 of said number may be placed at least partially on top of exactly one or at least one electronic component 204 for protecting and securing the underlying electronic component(s) 204 when the thermoplastic material 208 is molded on the substrate film 202 accommodating the components 204.

Figure 4C:
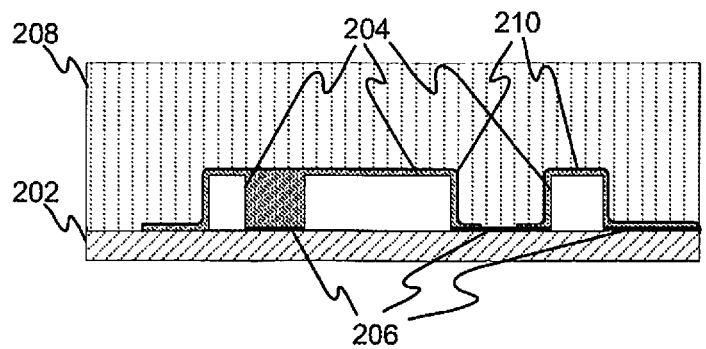
FIG. 4C illustrates a side view of a fifth embodiment of a multilayer structure according to the present invention.

Some optional embodiments of multilayer structures according to the present invention may comprise combinations of the features of the embodiments presented in FIGS. 4A and 4B. FIG. 4C thus illustrates a side view of one further embodiment, which discloses a multilayer structure 400c comprising a number of electronic components 204 and a number of preferably thermoformed covers 210, so that at least one cover 210 may be placed at least partially on top of exactly one electronic component 204 and at least one other cover 210 may be placed at least partially on top of a plurality of electronic components 204.

As alluded to above, the cover 210 layer may define or incorporate a substantially continuous piece or object of material for a plurality of thermoformed covers and/or discrete item for each thermoformed cover. In other words, functionally a plurality of thermoformed covers 210 may be provided as a one physically continuous object defining multiple suitable cover shapes such as domes or recesses depending on the viewpoint for the underlying electronics as illustrated in FIG. 46, or each of the thermoformed covers 210 may be provided as a discrete object as illustrated in FIG. 4C (on the right), or a combination of these approaches may be used to provide the thermoformed covers. A single cover or object of multiple covers may comprise one or more different materials. The cover materials may mutually differ even within a multilayer structure. And, the cover(s) 210 may at least collectively extend substantially completely over the surface of the concerned substrate film 202 that accommodates the electronics 204 as presented in FIGS. 4A and 4B, or the overlap may only be partial as presented in FIG. 4C.

The dimensions and the thickness of the thermoformed cover 210 may vary from an embodiment to another. For example the dimensions may be defined by the dimensions of the electronic component(s) 204. The thickness of the established multilayer structure may be few hundreds of microns or one or few millimeters, for instance. Accordingly, the thickness of the molded thermoplastic layer 208, 302, 304 may be few hundreds of microns or e.g. one or few millimeters. The thickness of the molded thermoplastic layer 208, 302, 304 may be constant or vary. Accordingly, the order of magnitude of the size of the electronic components 204 may be generally similar or smaller so that the structure can still host and embed them to a sufficient extent. The dimensions and thickness of the substrate film 202 may also vary from an embodiment to another. The thickness may be about 100 microns or few hundred microns, or a millimeter, for instance. The dimensions of the cover 210 may generally be similar, for instance. Wall thicknesses of the cover 210 may be considerably less than the actual height of the cover 210 as the cover may define dome or other hollow space for accommodating protrusions of electronics 204 on the substrate 202. The dimensions of the features of the embodiments illustrated in Figures are not in any particularly preferred scale with each other but have been mainly selected for clarity reasons instead.

Multilayer structures presented herein may find use in various electronic devices. For example, a portable electronic apparatus such as a wristop device could be provided with an embodiment of the structure, the structure optionally forming at least part of the associated wristband. Alternatively or additionally, the multilayer structures may be used in a light-emitting device, light-detecting device, light-sensing device, smart garment/wearable electronics, armband device, cellular device, tablet, phablet, controller device, computer mouse, joystick, other computer accessory, a display device, or a laptop computer. The suggested solution may further find use in vehicle electronics.

Figure 5:
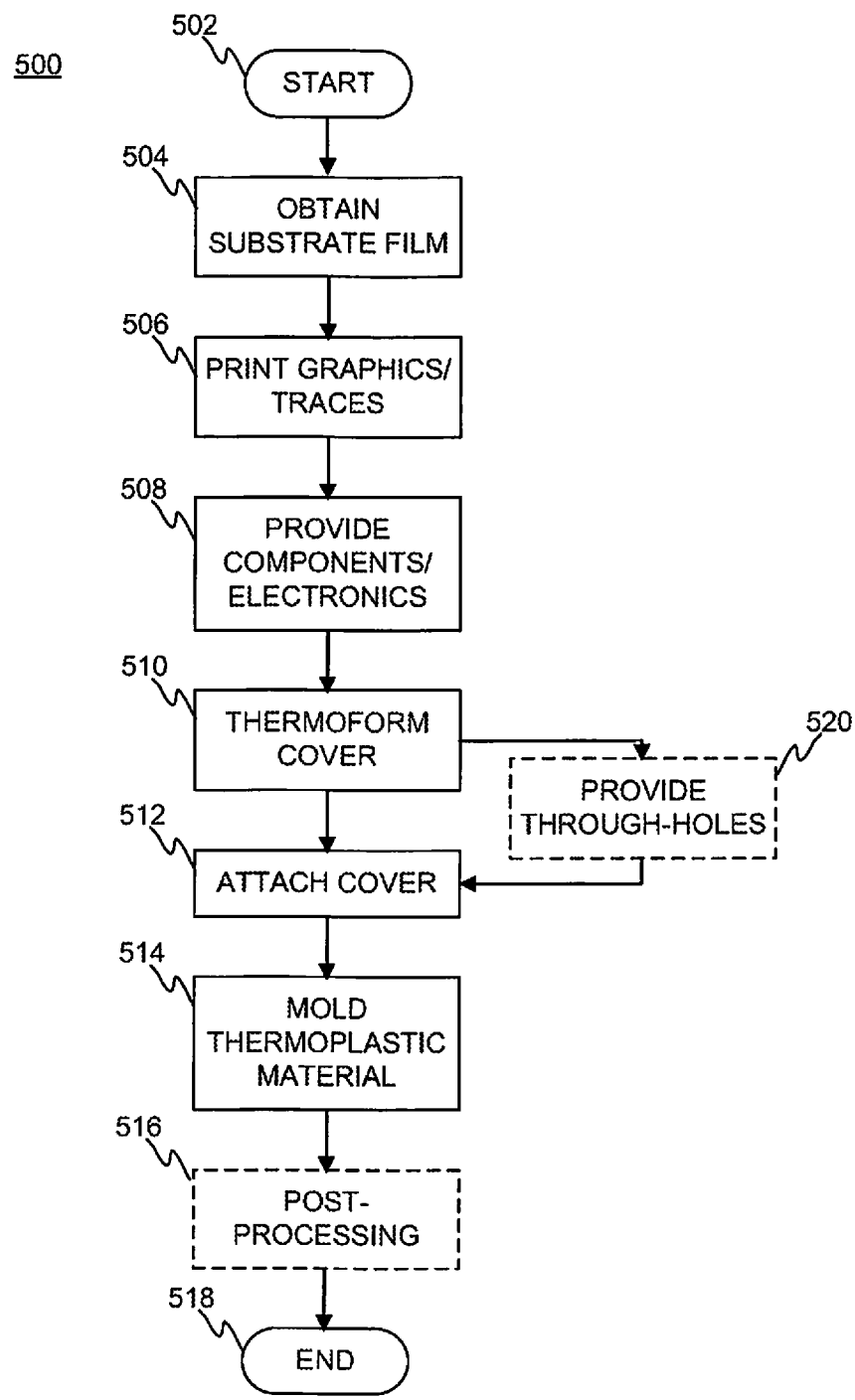
FIG. 5 illustrates a flow diagram disclosing an embodiment of a method according to the present invention.

FIG. 5 is a flow diagram disclosing an embodiment of a method according to the present invention.

At the beginning of the method for manufacturing the multilayer structure, a start-up phase 502 may be executed. During start-up 502, the necessary tasks such as material, component and tools selection, acquisition, calibration and other configuration may take place. Specific care must be taken that the individual elements and material selections work together and survive the selected manufacturing and installation process, which is naturally preferably checked up-front on the basis of the manufacturing process specifications and component data sheets, or by investigating and testing the produced prototypes, for example. The used equipment such as molding/IMD (in-mold decoration), lamination, bonding, thermoforming, and/or printing equipment, among others, may be thus ramped up to operational status at this stage.

At 504, at least one, preferably flexible, substrate film for accommodating electronics is obtained. A ready-made element of substrate material, e.g. roll of plastic film, may be acquired. In some embodiments the substrate film itself may be first produced in-house by molding or other methods from the desired starting material(s). Optionally, the substrate film is processed. It may be, for example, provided with openings, notches, recesses, cuts, reliefs, etc.

At 506, a number of conductive elements, such as conductor traces and contact areas (e.g. pads) for electrically coupling to the electronic components are provided on the substrate, preferably by one or more techniques of printed electronics. For example, screen, inkjet, flexographic, gravure or offset lithographic printing may be utilized. The traces may provide necessary electrical interconnections between the components and electronics in general.

At 508, electronics are provided on the substrate. Ready-made components such as various SMDs (surface-mount device) may be attached to the contact areas by solder and adhesives. Alternatively or additionally, printed electronics technology may be applied to actually manufacture at least part of the components, such as OLEDs (Organic LED), directly onto the film.

At 510, at least one cover for protecting and securing the electronic components is obtained. It is typically thermoformed. The thermoforming of the cover may be done by using a mold corresponding to the related electronic components, so that cover material is shaped in the presence of suction/heat according to the shape of the mold. The cover is configured to be attached 512 to the substrate film on top of the electronic component(s) with e.g. adhesive, soldering, and/or mechanical fixing such as hook and loop fasteners (colloquially known as Velcro). Alternatively or additionally, the cover(s) may be produced directly on top of the related electronic component provided on substrate film. The covers may be provided well in advance and a number of covers provided in advance may be stored in the meantime. The covers may also be purchased as ready-made or almost ready-made.

In some embodiments, a number of through-holes may be provided 520 to the cover to enable e.g. the light emitted, detected and/or sensed by the at least one component to propagate therewithin and outcouple therefrom. The through-holes may be for example drilled or stamped through the cover after e.g. thermoforming and before attaching the cover to the substrate film on top of the electronic components. Alternatively, the through-hole may be provided to the cover before e.g. thermoforming. In case the cover is manufactured by molding, hole(s) may be produced by proper mold design. The though-holes may enable the thermoplastic material to be molded through the through-holes also inside the cover between the cover and the electronics. Alternatively, the through-holes may be dimensioned so that the molded thermoplastic material will not enter the through-hole during the molding procedure or enters the hole and following space e.g. in a limited, more controllable fashion.

At 514, the thermoplastic material is molded upon at least one side of the substrate film and at least partially covered electronics thereon, such as a number of electronic components, related traces and contact areas. The applicable molding methods include injection molding, for instance. In some embodiments a plurality of thermoplastic material layers may be utilized. The plurality of thermoplastic materials may be molded using a multi-shot molding method. A molding machine with multiple molding units may be utilized. Alternatively, multiple machines or a single re-configurable machine could be used for sequentially providing the materials.

Item 516, refers to possible post-processing tasks. Further layers may be added into the multilayer structure. The layers may be of indicative or aesthetic value, for instance, and contain e.g. textile or rubber materials instead of or in addition to further plastics. The structure may be installed at a host device or host element such as a piece of footwear (e.g. shoes or (in)sole), helmet, shirt, trousers, compression garment, other garment, etc. Further elements such as electronics may be installed at the outer surface(s) of the structure, such as the exterior surface of the substrate.

At 518, method execution is ended.

Features reviewed in the preceding description may be used in combinations other than the combinations explicitly indicated. Although certain functions have been described with reference to certain features, those functions may be performable by other features whether described or not. Although some features have been described with reference to certain embodiments only, those features may also be present in other embodiments whether described or not.

The invention claimed is:

1. A method for manufacturing a multilayer structure for an electronic device, comprising:
   obtaining a flexible substrate film for accommodating electronics, providing a number of conductor traces on the flexible substrate film for electrically powering and/or connecting electronic components,
   providing at least one electronic component on the flexible substrate film,
   placing at least one thermoformed cover on top of the at least one electronic component,
   attaching the at least one thermoformed cover to the flexible substrate film,
   molding a thermoplastic material on the at least one thermoformed cover and substrate film accommodating the electronic components after attaching the at least one thermoformed cover to the flexible substrate film; and
   providing a number of through-holes to the thermoformed cover to enable light emitted, detected and/or sensed by the at least one component to propagate there within and outcouple therefrom.

2. The method of claim 1, further comprising thermoforming the thermoformed cover.

3. The method of claim 1, wherein the molding includes injection molding.

4. The method of claim 1, wherein the at least one thermoformed cover is soldered to the flexible substrate film independent of being overmolded with thermoplastic.

5. The method of claim 1, wherein the at least one thermoformed cover is mechanically fixed to the flexible substrate film independent of being overmolded with thermoplastic.

6. The method of claim 1, wherein the attaching comprises securing the at least one thermoformed cover with adhesive.

7. The method of claim 6, wherein the at least one thermoformed cover is attached with adhesive to the flexible substrate film independent of being overmolded with thermoplastic.

8. The method of claim 1, wherein the attaching comprises soldering the at least one thermoformed cover to the flexible film substrate.

9. The method of claim 1, wherein the attaching comprises mechanically fixing the at least one thermoformed cover to the flexible film substrate.

10. A method for manufacturing a multilayer structure for an electronic device, comprising:
    obtaining a flexible substrate film for accommodating electronics, providing a number of conductor traces on the flexible substrate film for electrically powering and/or connecting electronic components,
    providing at least one electronic component on the flexible substrate film,
    placing at least one thermoformed cover on top of the at least one electronic component,
    attaching the at least one thermoformed cover to the flexible substrate film,
    molding a thermoplastic material on the at least one thermoformed cover and substrate film accommodating the electronic components after attaching the at least one thermoformed cover to the flexible substrate film, wherein the attaching comprises securing the at least one cover with hook and loop fasteners.

11. An electronic device comprising:
    a flexible substrate film for accommodating electronics;
    at least one electronic component provided on the flexible substrate film; and
    a number of conductive traces provided on the flexible substrate film for electrically powering and/or connecting electronics including the at least one electronic component, and wherein at least one cover is attached to the flexible substrate film on top of the at least one electronic component, the at least one cover being overmolded with thermoplastic material, the at least one cover being attached to the flexible substrate film with hook and loop fasteners independent of being overmolded with the thermoplastic material.

* * * * *